US006844803B2

(12) United States Patent
Echols, Jr.

(10) Patent No.: US 6,844,803 B2
(45) Date of Patent: Jan. 18, 2005

(54) THIRTY-DEGREE LENGTH IMPEDANCE TRANSFORMER

(75) Inventor: Billy G. Echols, Jr., Jackson, MS (US)

(73) Assignee: MCI, Inc., Ashburn, VA (US)

( * ) Notice: Subject to any disclaimer, the term of this patent is extended or adjusted under 35 U.S.C. 154(b) by 35 days.

(21) Appl. No.: 10/077,368

(22) Filed: Feb. 15, 2002

(65) Prior Publication Data

US 2003/0156001 A1 Aug. 21, 2003

(51) Int. Cl.$^7$ .............................................. H01F 27/28
(52) U.S. Cl. ...................... 336/170; 336/174; 336/175; 333/33
(58) Field of Search ................................ 336/170, 174, 336/175, 178, 205–208; 333/32–35, 263

(56) References Cited

U.S. PATENT DOCUMENTS

| 2,403,252 | A | * | 7/1946 | Wheeler ....................... 333/33 |
|---|---|---|---|---|
| 2,900,610 | A | | 8/1959 | Allen et al. |
| 3,340,485 | A | | 9/1967 | Caron |
| 3,599,118 | A | * | 8/1971 | Large ........................... 331/96 |
| 3,792,385 | A | | 2/1974 | Napoli et al. |
| 5,341,280 | A | | 8/1994 | Divan et al. |
| 5,545,949 | A | * | 8/1996 | Bacher ......................... 315/39 |
| 5,767,754 | A | | 6/1998 | Menna |
| 6,337,608 | B1 | | 1/2002 | McLean et al. |
| 6,665,868 | B1 | | 12/2003 | Knowles et al. |

* cited by examiner

Primary Examiner—Tuyen T. Nguyen (57) ABSTRACT

A transformer for substantially matching the impedance of a generator and a load, which is coupled to the generator via a transmission line. The transformer comprises an outer conductor having an inner surface and an inner conductor having an outer surface that is positioned within the outer conductor. The transformer further includes a plurality of transformation sections, where each section provides a particular separation distance between the inner surface of the outer conductor and the outer surface of the inner conductor to yield a particular characteristic impedance for each of the plurality of transformation sections, thereby substantially matching the impedance of the generator to the load.

18 Claims, 6 Drawing Sheets

Table 1 - Normalized "step-down" ratio design criteria

| Ratio | Input Z | Section 1 | Section 2 | Section 3 | Section 4 | Section 5 | Output Z |
|---|---|---|---|---|---|---|---|
| 1.50 | 1.0 | 0.376 | 0.250 | 1.500 | 1.500 | 2.000 | 0.667 |
| 2.00 | 1.0 | 0.125 | 2.000 | 1.000 | 0.500 | 2.000 | 0.500 |
| 2.25 | 1.0 | 0.125 | 1.500 | 0.334 | 2.000 | 1.500 | 0.444 |
| 2.50 | 1.0 | 0.150 | 0.250 | 1.000 | 1.500 | 2.000 | 0.400 |
| 3.00 | 1.0 | 0.125 | 0.250 | 1.000 | 1.500 | 2.000 | 0.334 |
| 3.50 | 1.0 | 0.150 | 0.150 | 0.750 | 1.500 | 2.000 | 0.286 |
| 4.00 | 1.0 | 0.125 | 0.125 | 2.000 | 1.500 | 0.668 | 0.250 |
| 6.00 | 1.0 | 0.083 | 0.125 | 1.000 | 1.000 | 1.500 | 0.167 |
| 8.00 | 1.0 | 0.063 | 0.125 | 2.000 | 0.500 | 0.668 | 0.125 |

Table 2 - Normalized "step-up" ratio design criteria

| Ratio | Input Z | Section 1 | Section 2 | Section 3 | Section 4 | Section 5 | Output Z |
|---|---|---|---|---|---|---|---|
| 1.50 | 0.667 | 2.000 | 1.500 | 1.500 | 0.250 | 0.376 | 1.0 |
| 2.00 | 0.500 | 2.000 | 0.500 | 1.000 | 2.000 | 0.125 | 1.0 |
| 2.25 | 0.444 | 1.500 | 2.000 | 0.333 | 1.500 | 0.125 | 1.0 |
| 2.50 | 0.400 | 2.000 | 1.500 | 1.000 | 0.250 | 0.150 | 1.0 |
| 3.00 | 0.333 | 2.000 | 1.500 | 1.000 | 0.250 | 0.125 | 1.0 |
| 3.50 | 0.286 | 2.000 | 1.500 | 0.750 | 0.150 | 0.150 | 1.0 |
| 4.00 | 0.250 | 0.668 | 1.500 | 2.000 | 0.125 | 0.125 | 1.0 |
| 6.00 | 0.167 | 1.500 | 1.000 | 1.000 | 0.125 | 0.083 | 1.0 |
| 8.00 | 0.125 | 0.668 | 0.500 | 2.000 | 0.125 | 0.063 | 1.0 |

THIRTY-DEGREE LENGTH IMPEDANCE TRANSFORMER

BACKGROUND OF THE INVENTION

1. Field of the Invention

This invention relates generally to impedance matching transformers and, more particularly, to a thirty-degree length impedance transformer for substantially matching the impedance as seen from a signal generator to a load.

2. Description of the Related Art

A generator, such as a transmitter, for example, is typically designed to operate into a specific impedance of a network. However, a load (e.g., an antenna) that is coupled to the generator usually does not provide the specific impedance in which the generator is designed to operate.

When the impedance of the load and the impedance as seen by the generator are equal, maximum power is transferred from the generator to the load over a transmission line coupling the generator to the load. If a mismatch between the impedances of the load and generator occurs, however, the power that is not transferred to the load may be returned towards the generator through the transmission line. These rearward-traveling waves may combine with their respective forward-traveling waves along the transmission line, and because of the phase differences along various positions within the line, may cause standing waves in the transmission line by the alternate cancellation and reinforcement of the voltage and current distributed along the transmission line. The larger the standing waves that occur along the transmission line, the greater the mismatch of the impedance of the load that is coupled to the generator.

The present invention is directed to overcoming, or at least reducing the effects of, one or more of the problems set forth above.

SUMMARY OF THE INVENTION

One aspect of the present invention is seen in a transformer for substantially matching the impedance of a generator and a load, which is coupled to the generator via a transmission line. The transformer comprises an outer conductor having an inner surface and an inner conductor having an outer surface that is positioned within the outer conductor. The transformer further includes a plurality of transformation sections, where each section provides a particular separation distance between the inner surface of the outer conductor and the outer surface of the inner conductor to yield a particular characteristic impedance for each of the plurality of transformation sections, thereby substantially matching the impedance of the generator to the load.

Another aspect of the present invention is seen in a method for substantially matching the impedance of a generator and a load. The method includes providing an outer conductor having an inner surface, and an inner conductor positioned within the outer conductor, where the inner conductor has an outer surface. The method further includes providing a plurality of transformation sections that provide a particular separation distance between the inner surface of the outer conductor and the outer surface of the inner conductor to yield a particular characteristic impedance for each of the plurality of transformation sections.

Another aspect of the present invention is seen in a transformer for substantially matching the impedance of a generator and a load, which is coupled to the generator via a transmission line. The transformer comprises an outer conductor having an inner surface and an inner conductor having an outer surface that is positioned within the outer conductor. The transformer further includes a plurality of shims disposed along the inner surface of the outer conductor, where each shim provides a particular separation distance between the inner surface of the outer conductor and the outer surface of the inner conductor to yield a particular characteristic impedance for each of the plurality of shims.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 1:
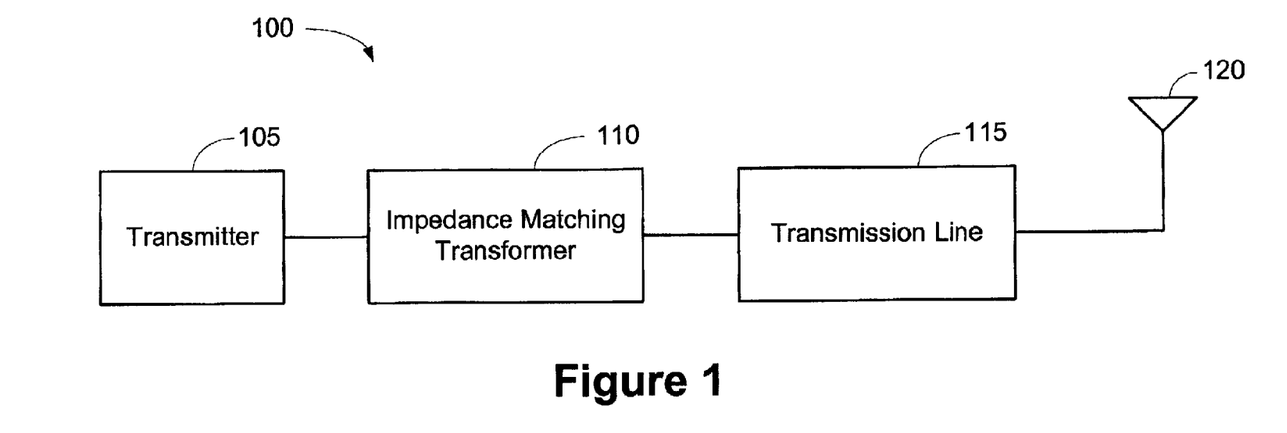
FIG. 1 shows a simplified block diagram of a wireless transmission network, including an impedance matching transformer, for impedance matching a transmitter to an antenna in accordance with one embodiment of the present invention.

Turning now to the drawings, and specifically referring to FIG. 1, a simplified block diagram of a transmission network 100, employing an impedance matching transformer, is shown in accordance with one embodiment of the present invention. In the illustrated embodiment, the transmission network 100 may be used for a variety of wireless applications including, but not necessarily limited to, AM, FM, SSB, TV, satellite, cellular, and PCS communications. In addition to the aforementioned examples, it will be appreciated that the transmission network 100 may operate in accordance with various other wireless transmission protocols without departing from the spirit and scope of the present invention. The transmission network 100 may reside in either a land-based station (e.g., a base station) or in a mobile station, such as a portable hand-held device, for example. It will also be appreciated that the transmission network 100 may alternatively take the form of a receiving network for receiving signals either in addition to or in lieu of transmitting signals.

In one embodiment of the present invention, the transmission network 100 comprises a transmitter 105 for generating signals, a transmission line 115 for carrying the signals generated by the transmitter 105, and an antenna 120 for sending the signals generated by the transmitter 105 via a wireless communication medium to a receiver station (not shown). It will be appreciated that the transmission network 100, shown in one of its most simplest forms, may include various other components (in addition to those components shown in FIG. 1) to facilitate the transmission of wireless signals. In addition, although the network 100 of FIG. 1 is provided in the form of a wireless transmission network, its application is not so limited. It will be appreciated that the transmitter 105 may take the form of any type of signal generator and the antenna 120 may take the form of any type of load. Accordingly, the transmission network 100 illustrated in FIG. 1 need not necessarily be limited to a wireless transmission network, but may take on a variety of other forms where the need for impedance matching a signal generator to a load is desirable.

In accordance with one embodiment of the present invention, the transmission line 115 that couples the transmitter 105 to the antenna 120 is provided in the form of a coaxial cable, such as RG8A coaxial cable, for example. It will be appreciated, however, that the transmission line 115 may include various other types of known transmission lines in lieu of a coaxial cable without departing from the spirit and scope of the present invention.

When the load impedance of the antenna 120 and the characteristic impedance as seen from the transmitter 105 of the transmission network 100 are equal, maximum power is transferred via the transmission line 115 to the antenna 120. If a mismatch of these impedances occurs, however, the power that is not transferred via the transmission line 115 to the antenna 120 may be returned towards the transmitter 105. These rearward-traveling waves may combine with their respective forward-traveling waves on the transmission line 115, and because of the phase differences along various positions within the transmission line 115, may cause standing waves in the transmission line 115 by the alternate cancellation and reinforcement of the voltage and current distributed along the transmission line 115.

To compensate for the impedance mismatch between the transmitter 105 and the antenna 120 that may occur, the transmission network 100 is provided with a thirty-degree (i.e., one-twelfth wavelength) impedance matching transformer 110. In accordance with the illustrated embodiment, the impedance matching transformer 110 substantially matches the characteristic impedance as seen from the transmitter 105 to the load impedance of the antenna 120 to maximize the power that is transferred from the transmitter 105 to the antenna 120 via the transmission line 115. For example, if the transmission network 100 forms a part of a wireless telephone, the telephone's antenna 120 may exhibit an impedance of 16.6 ohms for optimal performance; however, the transmitter 105 may have a characteristic impedance of 50 ohms, for example. Accordingly, it is desirable to "step-down" the impedance as seen from the transmitter 105 to substantially match the impedance of the antenna 120 to ensure optimal power is transferred from the transmitter 105 to the antenna 120.

Figure 2:
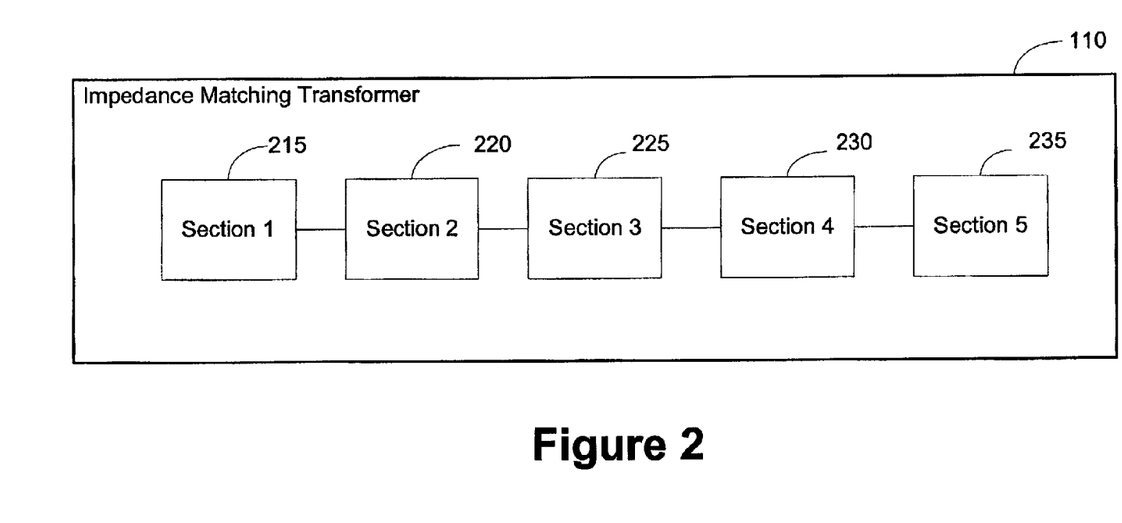
FIG. 2 illustrates a more detailed representation of the impedance matching transformer of FIG. 1.

Turning now to FIG. 2, a more detailed representation of the impedance matching transformer 110 is shown in accordance with the illustrated embodiment of the present invention. The impedance matching transformer 110 comprises five, six-degree transformation sections 215–235, which in combination, act to substantially match the characteristic impedance as seen from the transmitter 105 to the load impedance of the antenna 120. In one embodiment of the present invention, the impedance matching transformer 110 comprises five, six-degree length coaxial cables having various characteristic impedances that are connected end-to-end to form a total of thirty-degrees in length. It will be appreciated, however, that waveguides, striplines, eccentric coaxial, twin wire, microstrip, trough line, slab line, equal-gap rectangular, or various other techniques for producing differing characteristic impedances with distributed reactances may be used in lieu of coaxial cables without departing from the spirit and scope of the present invention. The thirty-degree impedance transformer 110 of the present invention enables matching almost any impedance between the transmitter 105 and the antenna 120, while maintaining a relatively small physical size. In one embodiment, the impedance matching transformer 110 may occupy a space of less than one-inch in length.

Figure 3A:
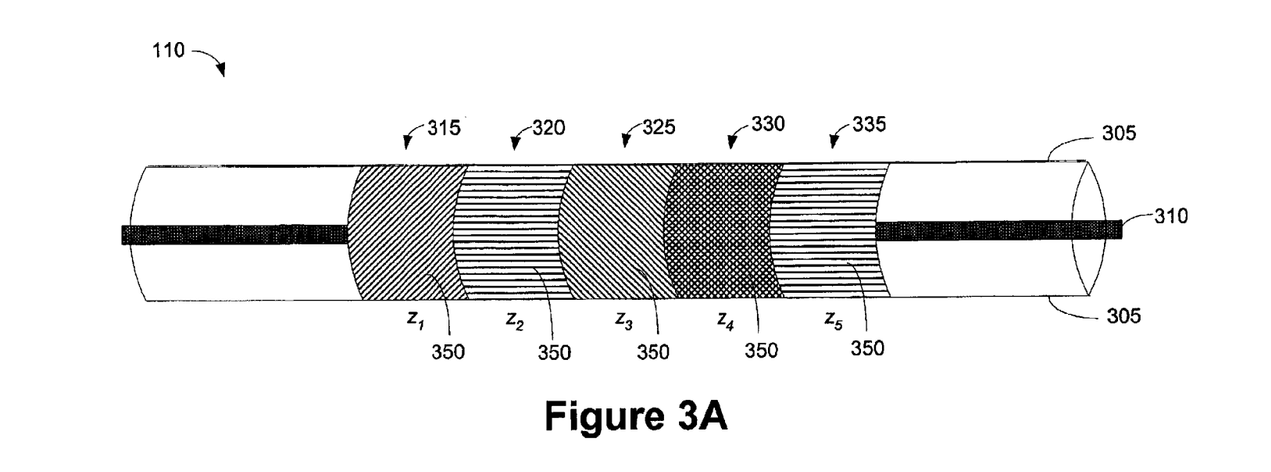
FIG. 3A provides a side-view perspective of the impedance matching transformer of FIG. 2 according to one embodiment of the present invention.

Turning now to FIG. 3A, a side-view perspective of the impedance matching transformer 110 is shown in accordance with one embodiment of the present invention. The impedance matching transformer 110 comprises an outer conductor 305 and an inner conductor 310 that is disposed lengthwise within the outer conductor 305, such that the outer conductor 305 surrounds the inner conductor 310. In one embodiment, the outer conductor 305 may take the form of a copper tube. It will be appreciated, however, that the outer conductor 305 may be constructed out of other suitable conductive materials, as opposed to copper, without departing from the spirit and scope of the present invention.

In the illustrated embodiment, the outer conductor 305 includes five, six-degree length transformation sections (i.e., sections 315–335). In accordance with one embodiment of the present invention, each six-degree length transformation section 315–335 may take the form of a shim 350 that is disposed along the inner surface of the outer conductor 305 so that the shim 350 encircles the inner conductor 310. The shims 350, as illustrated in FIG. 3A, are viewed as if one could see through the outer conductor 305; although in reality, the shims 350 reside on the inner surface of the outer conductor 305, and are not viewable from the outside surface of the outer conductor 305.

Each shim 350 located at the transformation sections 315–335 of the outer conductor 305 may have a different thickness, thereby essentially varying the distance between the inner surface of the outer conductor 305 and the outer surface of the inner conductor 310. A particular thickness of the shim 350 will yield a specific characteristic impedance (i.e., impedances $z_1$–$z_5$) for its corresponding transformation section 315–335 of the outer conductor 305. In the illustrated embodiment, the five shims 350 are adjoined together, side-by-side, along the inner surface of the outer conductor 305 such that there are no spaces or gaps between the five adjoining shims 350.

In one embodiment, the shims 350 may be serially connected to one another, and affixed to the inner surface of the outer conductor 305 to prevent any movement between the adjoining shims 350. In an alternative embodiment of the present invention, the shims 350 may be configured with mating teeth (not shown) on each mating edge of the shims 350 such that the shims 350 may be joined in a "locking" relationship so as to form a single unit along the inner surface of the outer conductor 305. The "mating edge" is the edge of one shim 350 that is adjacent the edge of the adjoining shim 350. The mating of the shims 350 may reduce the likelihood that the shims 350 will shift their positioning along the inner surface of the outer conductor 305, thereby decreasing the probability of gaps or spaces from forming between the shims 350. It will further be appreciated that the shims 350 may be joined using other types of mating mechanisms, as opposed to the use of mating teeth, as herein described, without departing from the spirit and scope of the present invention.

Figure 3B:
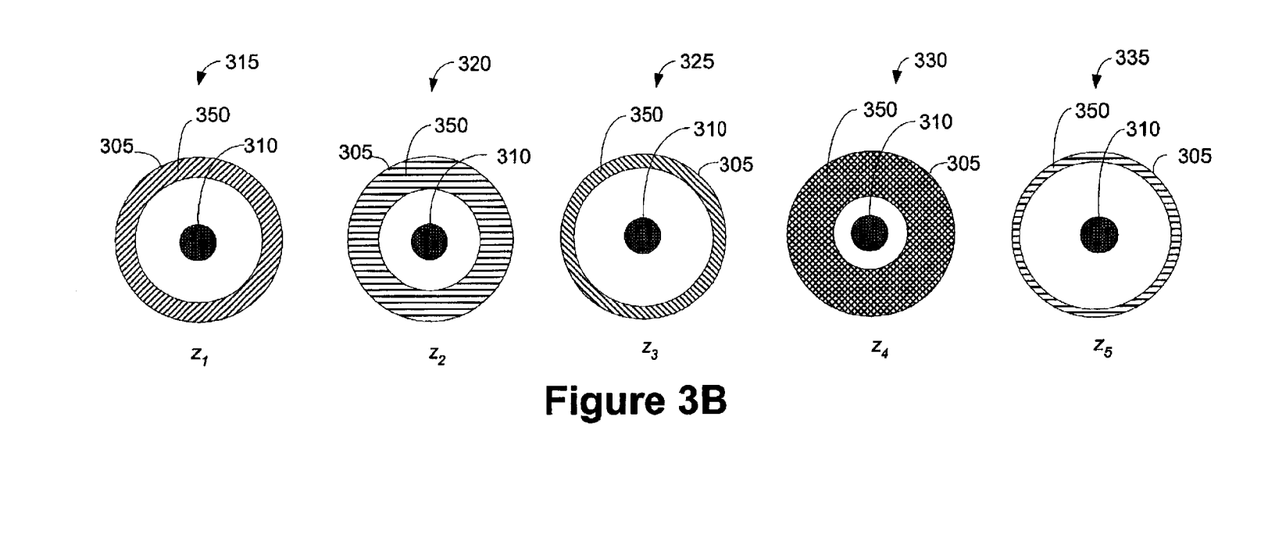
FIG. 3B shows a cross-sectional view for each transformation section of the impedance matching transformer of FIG. 3A.

Referring to FIG. 3B, a cross-sectional view of each of the five transformation sections 315–335 of the outer conductor 305 is shown. The shim 350 for each transformation section 315–335 is disposed on the inner surface of the outer conductor 305 and encircles the inner conductor 310. In the illustrated embodiment, a shim 350 corresponding to one of the transformation sections 315–335 will have a specific thickness, thereby providing a particular separation distance between the inner surface of the shim 350 (indicated by the shaded region adjacent the inner surface of the outer conductor 305) and the inner conductor 310 of the transformer 110. The varying of the separation distance between the inner surface of the shim 350 and the outer surface of the inner conductor 310 will cause each shim 350 to yield a different characteristic impedance for each of the five transformation sections 315–335 of the outer conductor 305. By providing specific characteristic impedances for each transformation section 315–335 along the outer conductor 305, the transformer 110 is capable of substantially matching the impedance as seen from the transmitter 105 to the impedance of the antenna 120, thereby permitting maximum power to be transferred from the transmitter 105 to the antenna 120.

Figure 4:
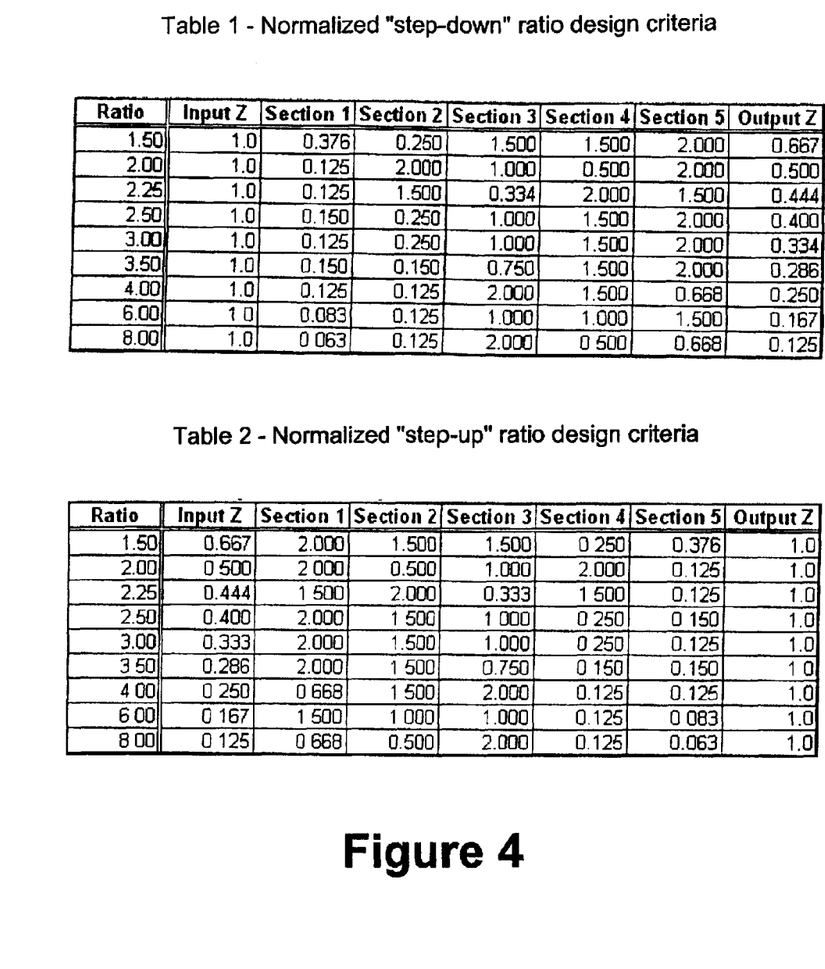
FIG. 4 illustrates tables that provide normalized "step-down" and "step-up" ratio design criteria for each transformation section of the impedance matching transformer of FIG. 2.

Turning now to FIG. 4, tables are illustrated for determining the characteristic impedances ($z_1$–$z_5$) for each of the five transformation sections 315–335 of the outer conductor 305 to substantially match a specific input impedance (as seen from the transmitter 105) to a desired output impedance (of the antenna 120) for the transmission network 100. In particular, table 1 provides normalized "step-down" ratio design criteria for each of the transformation sections 315–335 when it is desired to reduce the input impedance of the transmission network 100 to substantially match the network's output impedance. Table 2, on the other hand, provides normalized "step-up" ratio design criteria for each of the transformation sections 315–335 when it is desired to increase the input impedance of the transmission network 100 to substantially match the network's output impedance. The first column of these tables provides the ratio in which it is desired to either "step-down" (table 1) or "step-up" (table 2) the input impedance (i.e., $z_{input}$) to achieve the desired output impedance (i.e., $z_{output}$) of the transmission network 100. Each column of the tables corresponding to the transformation sections 315–335 has a factor by which to multiply by the input impedance ($z_{input}$) to determine the characteristic impedances ($z_1$–$z_5$) needed for each transformation section 315–335 to yield the desired output impedance ($z_{output}$).

For example, if it is desired to reduce an input impedance ($z_{input}$) of 75 ohms by a ratio of four to match an output impedance of 18.75 ohms of the network 100, Table 1 is utilized to determine the characteristic impedances ($z_1$–$z_5$) of each transformation section 315–335 of the transformer 110 to "step-down" the input impedance ($z_{input}$) of 75 ohms to the desired output impedance ($z_{output}$) of 18.75 ohms. The step-down ratio is determined by dividing the input impedance ($z_{input}$) by the desired output impedance ($z_{output}$) for the transmission network 100. As previously mentioned in the example, it is desired to reduce the input impedance of 75 ohms to approximately 18.75 ohms (the output impedance). Accordingly, the step-down ratio would be four (i.e., $z_{input}/z_{output}$). Since a step-down ratio of four is desired in this particular example, the input impedance ($z_{input}$) of 75 ohms is multiplied by each factor provided for in each of the columns corresponding to the transformation sections 315–335 to yield the characteristic impedances ($z_1$–$z_5$) of each transformation section 315–335 of the transformer 110. Thus, in the example provided, the characteristic impedance ($z_1$) for transformation section 315 will be (0.125)×($z_{input}$)= (0.125)×(75 ohms)=9.375 ohms, the characteristic impedance ($z_2$) for transformation section 320 will be (0.125)×(75 ohms)=9.375 ohms, the characteristic impedance ($z_3$) for transformation section 325 will be (2.000)×(75 ohms) 150 ohms, the characteristic impedance ($z_4$) for transformation section 330 will be (1.500)×(75 ohms)=112.5 ohms, and the characteristic impedance ($z_5$) for transformation section 335 will be (0.668)×(75 ohms)=50.1 ohms.

When the characteristic impedances ($z_1$–$z_5$) for each transformation section 315–335 of the transformer 110 are determined, the thickness of the shims 350 that correspond to each transformation section 315–335 may be determined to yield the particular characteristic impedance ($z_1$–$z_5$) for each transformation section 315–335. The characteristic impedance ($z_1$–$z_5$) is equal to 138 log (b/a), where b is the inside diameter of the outer conductor 305 and a is the outer diameter of the inner conductor 310. Accordingly, the thickness of the shims 350 that correspond to each transformation section 315–335 may be determined by the inside diameter "b" of the outer conductor 305.

Figure 5:
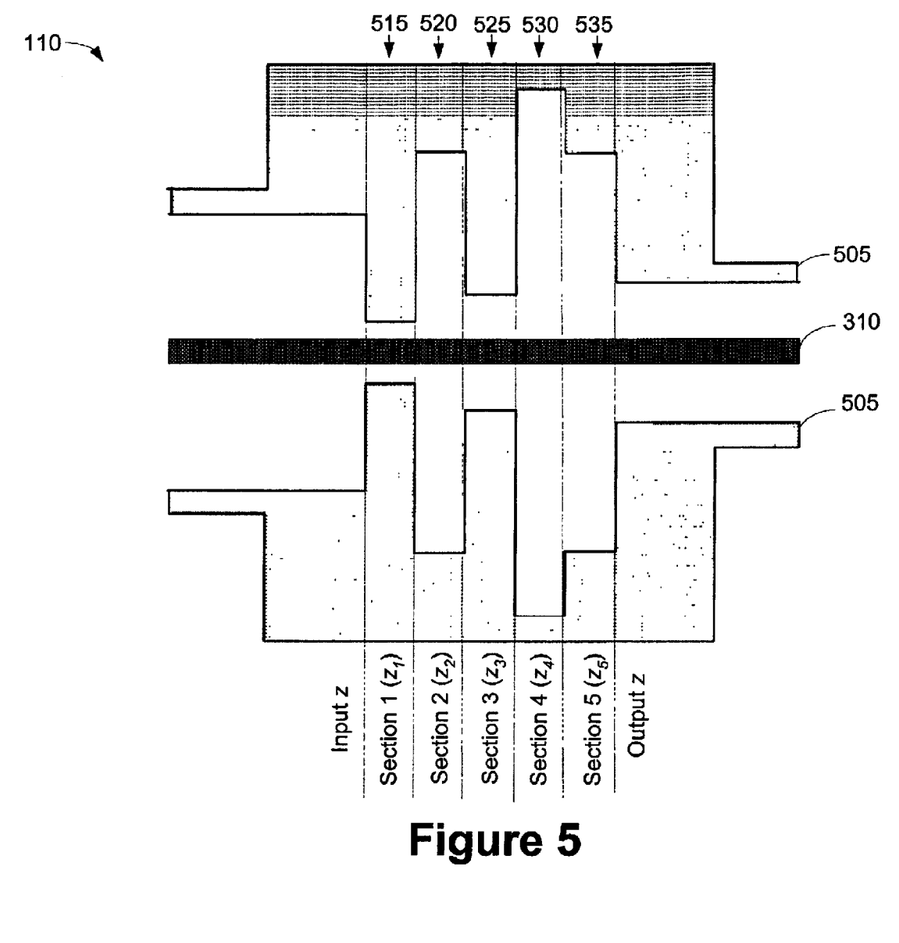
FIG. 5 provides a side-view perspective of the impedance matching transformer of FIG. 2 in accordance with another embodiment of the present invention.

Turning now to FIG. 5, a side-view perspective of the impedance matching transformer 110 is shown in accordance with another embodiment of the present invention. In this particular embodiment, as opposed to using shims 350 of differing thicknesses to vary the separation distance or gap between the inner and outer conductors, an outer conductor 505 is provided that has a series of five, six-degree length transformation sections 515–535 formed therein. Each transformation section 515–535 formed within the outer conductor 505 provides a specific separation distance or gap between the inner surface of the outer conductor 505 and the outer surface of the inner conductor 310. The varying of the separation distance between the inner surface of the outer conductor 505 and the outer surface of the inner conductor 310 will cause the transformer 110 to yield a different characteristic impedance ($z_1$–$z_5$) for each of the five transformation sections 515–535 of the outer conductor 505. The specific characteristic impedances ($z_1$–$z_5$) for each transformation section 515–535 will enable the transformer 110 to substantially match the impedance as seen from the transmitter 105 to the impedance of the antenna 120, thereby permitting maximum power to be transferred from the transmitter 105 to the antenna 120. The specific characteristic impedances ($z_1$–$z_5$) for each of the transformation sections 515–535 of the outer conductor 505 may be determined using either the normalized "step-down" or "step-up" ratio design criteria in the tables of FIG. 4, as previously described.

Figure 6:
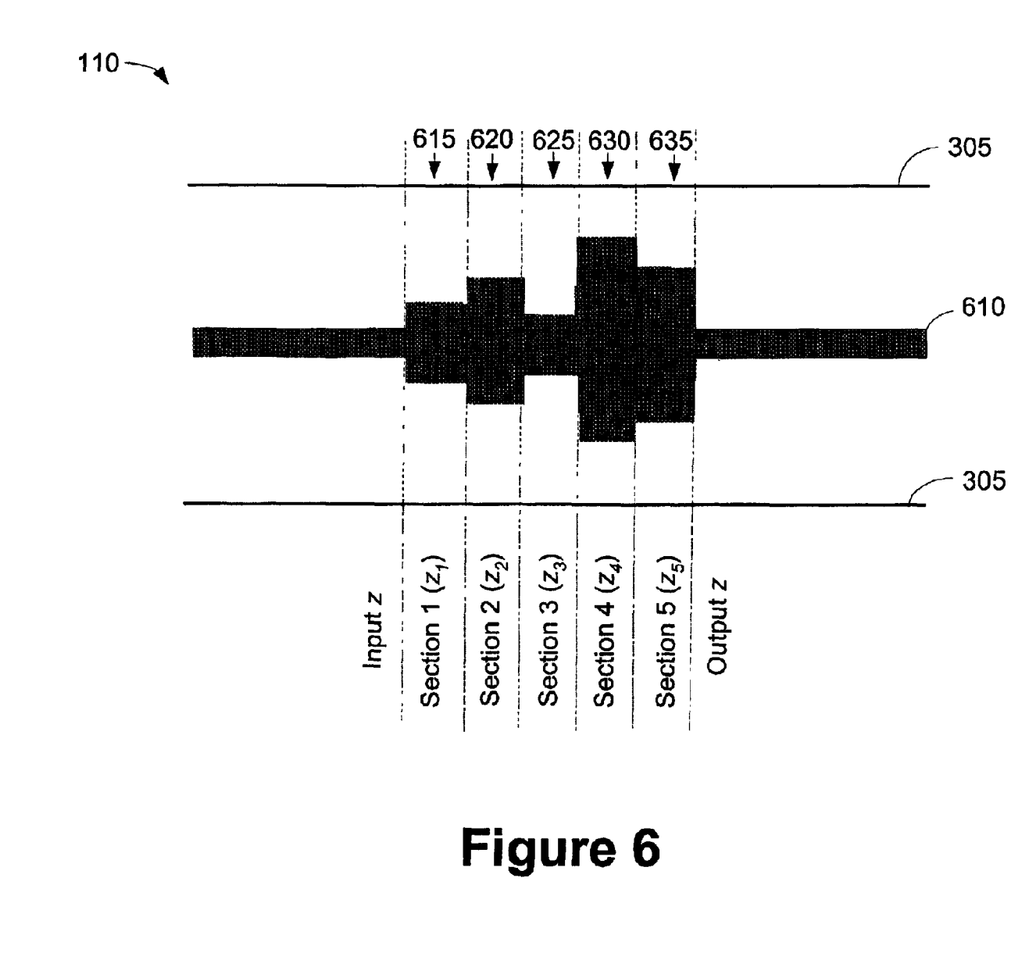
FIG. 6 illustrates a side-view perspective of the impedance matching transformer of FIG. 2 according to yet another embodiment of the present invention.

Turning now to FIG. 6, the impedance matching transformer 110 is shown in accordance with another embodiment of the present invention. In this particular embodiment, the inner surface of the outer conductor 305 remains uniform, however, an inner conductor 610 is provided with a series of five, six-degree length transformation sections 615–635 formed therein. Each transformation section 615–635 formed within the inner conductor 610 provides a specific separation distance or gap between the inner surface of the outer conductor 305 and the outer surface of the inner conductor 610. Varying the separation distance between the inner surface of the outer conductor 305 and the outer surface of the inner conductor 610 will cause the transformer 110 to yield a different characteristic impedance ($z_1$–$z_5$) for each of the five transformation sections 615–635 of the inner conductor 610. The specific characteristic impedances ($z_1$–$z_5$) for each of the transformation sections 615–635 of the inner conductor 610 may be determined using either the normalized "step-down" or "step-up" ratio design criteria in the tables of FIG. 4, as previously described.

Figure 7:
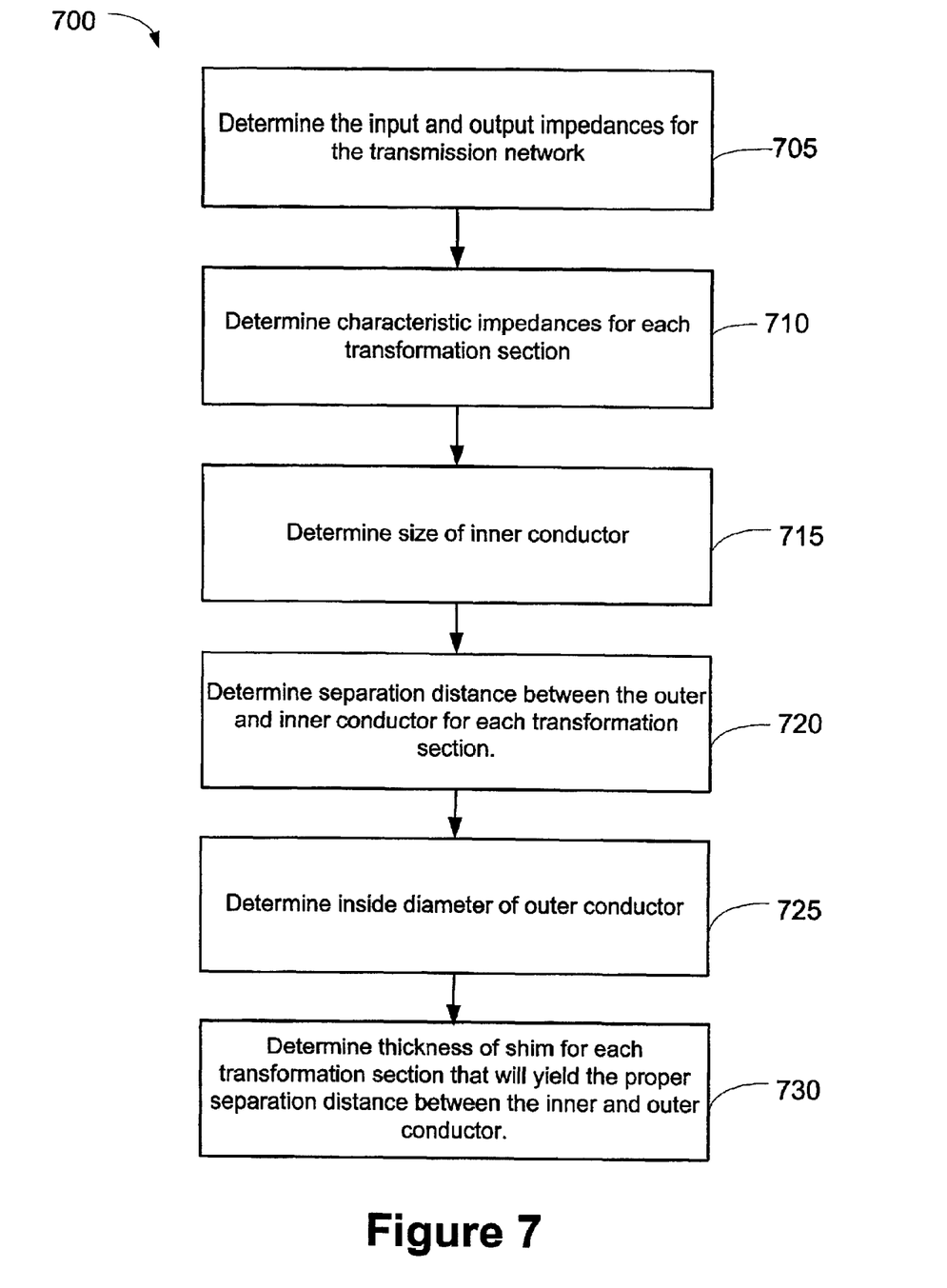
FIG. 7 illustrates a process for designing the impedance matching transformer of FIG. 2 according to one embodiment of the present invention.

Turning now to FIG. 7, a process 700 for designing a thirty-degree impedance matching transformer 110 is shown according to one embodiment of the present invention. The process 700 commences at block 705, where the input and output impedances are determined for the transmission network 100. Specifically, the input impedance of the transmission network 100 is the impedance as seen from the transmitter 105 and the output impedance is the load impedance of the antenna 120. At block 710, the characteristic impedances ($z_1$–$z_5$) are determined for each of the transformation sections 315–335 of the outer conductor 305 using the normalized "step-down" or "step-up" ratio design criteria in the tables of FIG. 4, as previously described.

Subsequent to determining the characteristic impedances ($z_1$–$z_5$) for each of the transformation sections 315–335, the size (i.e., gauge) of the inner conductor 310 is determined to match the output impedance of the transmitter 105 at block 715. In the illustrated embodiment, the size of the inner conductor 310 is selected based upon the current handling requirements at the RF frequency in which the transmitter 105 is tuned.

After determining the size of the inner conductor 310 at block 715, the separation or gap distance between the inner surface of the outer conductor 305 and the outer surface of the inner conductor 310 for each transformation section 315–335 is determined at block 720 based upon the characteristic impedances ($z_1$–$z_5$) for each transformation section 315–335.

The process 700 continues at block 725, where the inside diameter of the outer conductor 305 is determined from the gauge size that is used for the outer conductor 205. Based upon the separation or gap distance determined between the inner surface of the outer conductor 305 and the outer surface of the inner conductor 310 determined at block 720, the thickness for each shim 350 corresponding to each transformation section 315–335 of the outer conductor 305 is determined at block 730. The thickness for each shim 350 is selected such that it will yield the desired separation or gap distance between the inner surface of the outer conductor 305 and the outer surface of the inner conductor 310, thereby yielding the desired characteristic impedance for each transformation section 315–335 of the outer conductor 305.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A transformer for substantially matching the impedance of a generator and a load, coupled to the generator via a transmission line, comprising:

an outer conductor having an inner surface;

an inner connector positioned within the outer conductor, and having an outer surface; and a plurality of transformation sections, each of the plurality of transformation sections including a shim, a thickness of at least one of the shims differs from a thickness of at least one other shim; and wherein each of the plurality of transformation sections provides a particular separation distance between the inner surface of the outer conductor and the outer surface of the inner conductor to yield a particular characteristic impedance for each of the plurality of transformation sections, thereby substantially matching th impedance of the generator to the load.

2. The transformer of claim 1, wherein the plurality of transformation sections includes five, six-degree length transformation sections connected in series.

3. The transformer of claim 2, wherein the shim of each of the plurality of transformation sections is disposed along the inner surface of the outer conductor, with each shim yielding the particular characteristic impedance.

4. The transformer of claim 3, wherein each shim is connected end-to-end along the inner surface of the outer conductor.

5. The transformer of claim 2, wherein each of the plurality of transformation sections are formed within the outer conductor.

6. The transformer of claims 5, wherein each of the plurality of transformation sections provides a particular separation distance between th inner surface of the outer conductor and the outer surface of the inner conductor, thereby yielding the particular characteristic impedance for each transformation section.

7. The transformer of claim 2, wherein each of the plurality of transformation sections are formed within the inner conductor.

8. The transformer of claim 7, wherein each of the plurality of transformation sections provides a particular separation distance between the inner surface of the outer conductor and the outer surface of the inner conductor, thereby yielding the particular characteristic impedance for each transformation section.

9. A method for substantially matching the impedance of a generator and a load, coupled to the generator via a transmission line, comprising:

providing an outer conductor having an inner surface;

providing an inner conductor positioned within the outer conductor, and having an outer surface; and providing a plurality of transformation sections, each of the plurality of transformation sections including a shim with an associated thickness, the thickness of one of the shims being different than the thickness of another one of the shims, the shims providing a particular separation distance between the inner surface of the outer conductor and the outer surface of the inner conductor to yield a particular characteristic impedance for each of the plurality of transformation sections.

10. The method of claim 9, wherein providing a plurality of transformation sections further comprises providing five, six-degree length transformation sections connected in series.

11. The method of claim 10, wherein the shims are disposed along the inner surface of the outer conductor.

12. The method of claim 10, wherein providing a plurality of transformation sections further comprises:

providing a plurality of transformation sections that are formed within the outer conductor.

13. The method of claim 12, wherein each of the plurality of transformation sections provides a particular separation distance between th inner surface of the outer conductor and the outer surface of the inner conductor, thereby yielding the particular characteristic impedance for each transformation section.

14. The method of claim 10, wherein providing a plurality of transformation sections comprises:

providing a plurality of transformation sections that are form within the inner conductor.

15. The method of claim 14, wherein each of the plurality of transformation sections provides a particular separation distance between the inner surface of the outer conductor and the outer surface of the inner conductor, thereby yielding the particular characteristic impedance for each transformation section.

16. A transformer for substantially matching the impedance of a generator and a load, coupled to the generator via a transmission line, comprising:

an outer conductor having an inner surface;

an inner conductor positioned within the outer conductor, an having an outer surface; and a plurality of shims disposed along the inner surface of the outer conductor; and wherein each of the plurality of shims provides a particulars separation distance between the inner surface thereof and the outer surface of the inner conductor to yield a particular characteristic impedance for each of the plurality of shims, and wherein a thickness of one of the plurality of shims differs from a thickness of another one of the plurality of shims.

17. The transformer of claim 16, wherein the plurality of shims includes five, six-degree length shims connected end-to-end along the inner surface of the outer conductor.

18. The transformer of claim 17, wherein the generator includes a transmitter and the load includes an antenna of a wireless transmission network.

* * * * *